(12) United States Patent
Kakinuma

(10) Patent No.: US 11,769,676 B2
(45) Date of Patent: Sep. 26, 2023

(54) PROTECTIVE SHEET STICKING APPARATUS

(71) Applicant: DISCO CORPORATION, Tokyo (JP)

(72) Inventor: Yoshinori Kakinuma, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 17/656,087

(22) Filed: Mar. 23, 2022

(65) Prior Publication Data
US 2022/0310421 A1    Sep. 29, 2022

(30) Foreign Application Priority Data

Mar. 25, 2021 (JP) .................................. 2021-051950

(51) Int. Cl.
| | |
|---|---|
| *H01L 21/67* | (2006.01) |
| *B32B 37/12* | (2006.01) |
| *B32B 27/06* | (2006.01) |
| *B32B 7/12* | (2006.01) |
| *B32B 38/00* | (2006.01) |

(52) U.S. Cl.
CPC .......... *H01L 21/67132* (2013.01); *B32B 7/12* (2013.01); *B32B 27/06* (2013.01); *B32B 37/12* (2013.01); *B32B 38/105* (2013.01); *B32B 2457/14* (2013.01)

(58) Field of Classification Search
CPC ........... H01L 21/67132; H01L 21/6836; H01L 21/67092; H01L 2221/6834; B32B 27/06; B32B 37/12; B32B 2457/14; B32B 38/0004; B32B 43/003; B62D 7/2614; B62D 7/2628; B62D 3/10; Y10T 156/1348; Y10T 156/108; Y10T 83/148; Y10T 83/541; Y10T 83/8776
See application file for complete search history.

(56) References Cited

U.S. PATENT DOCUMENTS 6,258,198 B1 * 7/2001 Saito ................. H01L 21/67092
156/496

FOREIGN PATENT DOCUMENTS

| JP | 10112492 A | * | 4/1998 |
| JP | 2006005131 A | | 1/2006 |

* cited by examiner

*Primary Examiner* — John L Goff, II
(74) *Attorney, Agent, or Firm* — Greer Burns & Crain Ltd.

(57) ABSTRACT

A protective sheet sticking apparatus includes a cutting unit that cuts a protective sheet stuck to a wafer along an outer circumference of the wafer while bringing a cutting part of a cutting blade into contact with the outer circumference of the wafer. The cutting unit has a cutting blade support part that supports the cutting blade rotatably in such a manner that the direction of a cutting edge of the cutting part is adjustable from the outside in the radial direction of the wafer to the inside. The cutting blade support part includes a first biasing spring that makes biasing to cause the cutting part to be oriented toward the inside and a second biasing spring that makes biasing to cause the cutting part to be oriented toward the outside in order to prevent the cutting part from being oriented toward the inside by a predetermined angle or larger.

2 Claims, 5 Drawing Sheets

PROTECTIVE SHEET STICKING APPARATUS

BACKGROUND OF THE INVENTION

Field of the Invention

The present invention relates to a protective sheet sticking apparatus.

Description of the Related Art

Conventionally, in a semiconductor manufacturing process, a protective sheet sticking apparatus that sticks a protective sheet such as a protective tape to a surface of a wafer as an adherend in which plural semiconductor devices are formed and cuts the stuck protective sheet by a cutting blade along the outer edge of the wafer is used (for example, refer to Japanese Patent Laid-open No. 2006-005131).

SUMMARY OF THE INVENTION

In such a protective sheet sticking apparatus, the cutting blade moves along the outer circumferential edge of the wafer and cuts the protective sheet along the circular wafer. Thereafter, the wafer is thinned by a grinding apparatus or a polishing apparatus or is processed by a laser beam. Normally, the wafer has an orientation flat or notch that indicates the direction of the crystal orientation at the outer circumference. Even when the protective sheet is cut along the circular shape, if the direction of the cutting edge of the cutting blade is not caused to be along the orientation flat in particular, the cut protective sheet widely protrudes from the wafer. Therefore, the protective sheet becomes an obstacle in the next step and interferes with grinding or the like. Thus, separately from the method of cutting the protective sheet for the circular part, a method in which a table or the cutting blade is moved along the shape of the orientation flat to cut the protective sheet is executed for the part of the orientation flat. In this case, there is a problem that an actuator for control of the table or the cutting blade is required, and therefore the size of the apparatus becomes larger, and the cost increases.

Thus, an object of the present invention is to provide a protective sheet sticking apparatus that can easily cause the direction of a cutting part that cuts a protective sheet to follow both a circular part of the outer circumferential edge of a wafer having an orientation flat and the part of the orientation flat.

In accordance with an aspect of the present invention, there is provided a protective sheet sticking apparatus that sticks a protective sheet to a wafer with a circular shape. The protective sheet sticking apparatus includes a sheet sticking unit that sticks the protective sheet to the wafer held by a table and a cutting unit that cuts the protective sheet stuck to the wafer by the sheet sticking unit along an outer circumference of the wafer while bringing a cutting part of a cutting blade into contact with the outer circumference of the wafer. The cutting unit has a cutting blade support part that supports the cutting blade rotatably in such a manner that a direction of a cutting edge of the cutting part is adjustable from an outside in a radial direction of the wafer to an inside. The cutting blade support part includes a first biasing spring that makes biasing to cause the cutting part to be oriented toward the inside and a second biasing spring that makes biasing to cause the cutting part to be oriented toward the outside in order to prevent the cutting part from being oriented toward the inside by a predetermined angle or larger. A direction of the cutting part is adjusted to the predetermined angle with respect to the outer circumference of the wafer.

Preferably, the cutting blade support part further includes a third biasing spring that makes biasing to prevent the direction of the cutting part from being oriented toward the outside by a predetermined angle or larger.

According to the present invention, it is possible to easily cause the direction of the cutting part that cuts the protective sheet to follow both the circular part of the outer circumferential edge of the wafer having the orientation flat and the part of the orientation flat.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

An embodiment of the present invention will be described in detail below with reference to the drawings. The present invention is not limited by contents described in the following embodiment. Furthermore, what can be easily envisaged by those skilled in the art and what are substantially the same are included in constituent elements described below. Moreover, configurations described below can be combined as appropriate. In addition, various kinds of omission, replacement, or change of a configuration can be carried out without departing from the gist of the present invention.

Figure 1:
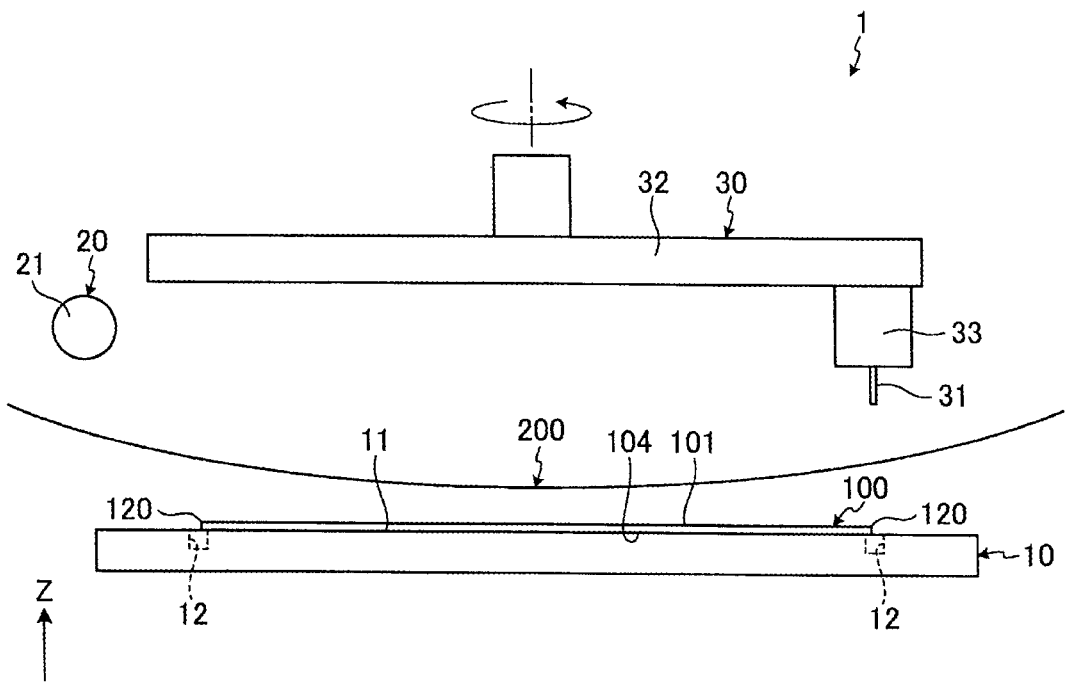
FIG. 1 is a sectional view illustrating a configuration example of a protective sheet sticking apparatus according to an embodiment.
Figure 2:
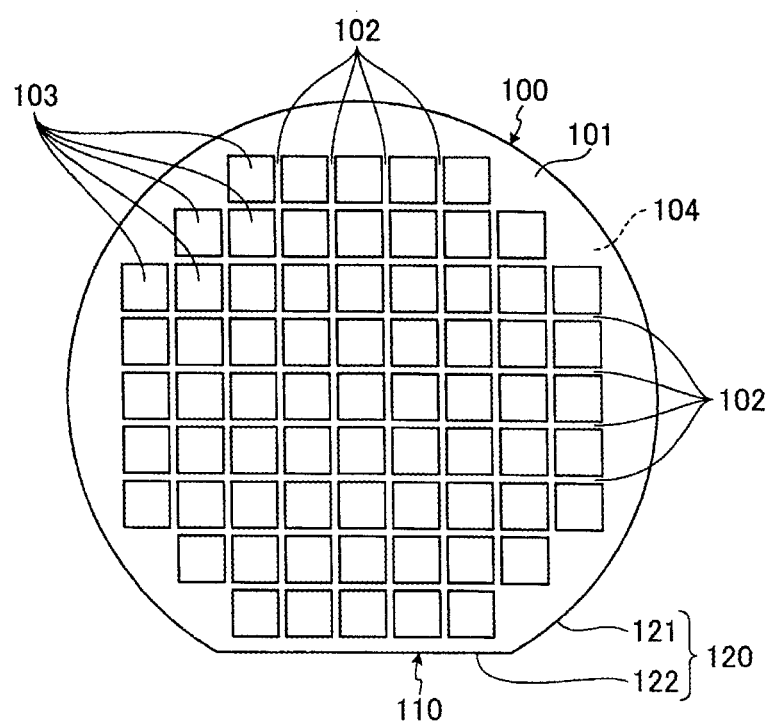
FIG. 2 is a plan view illustrating a wafer that is a sheet sticking target of the protective sheet sticking apparatus in FIG. 1.
Figure 3:
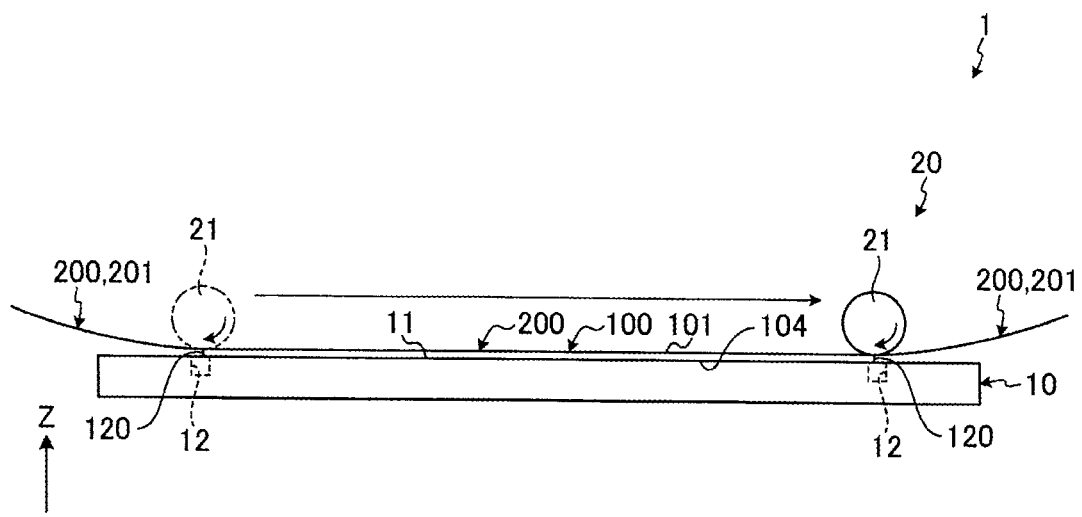
FIG. 3 is a sectional view illustrating a sheet sticking unit in FIG. 1.
Figure 4:
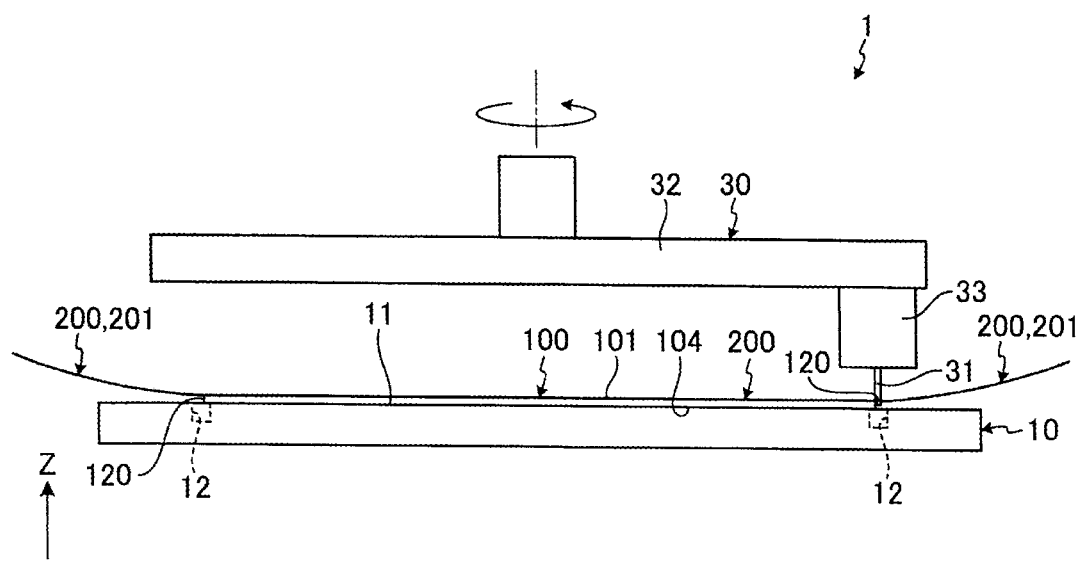
FIG. 4 is a sectional view illustrating the outline of a cutting unit in FIG. 1.
Figure 5:
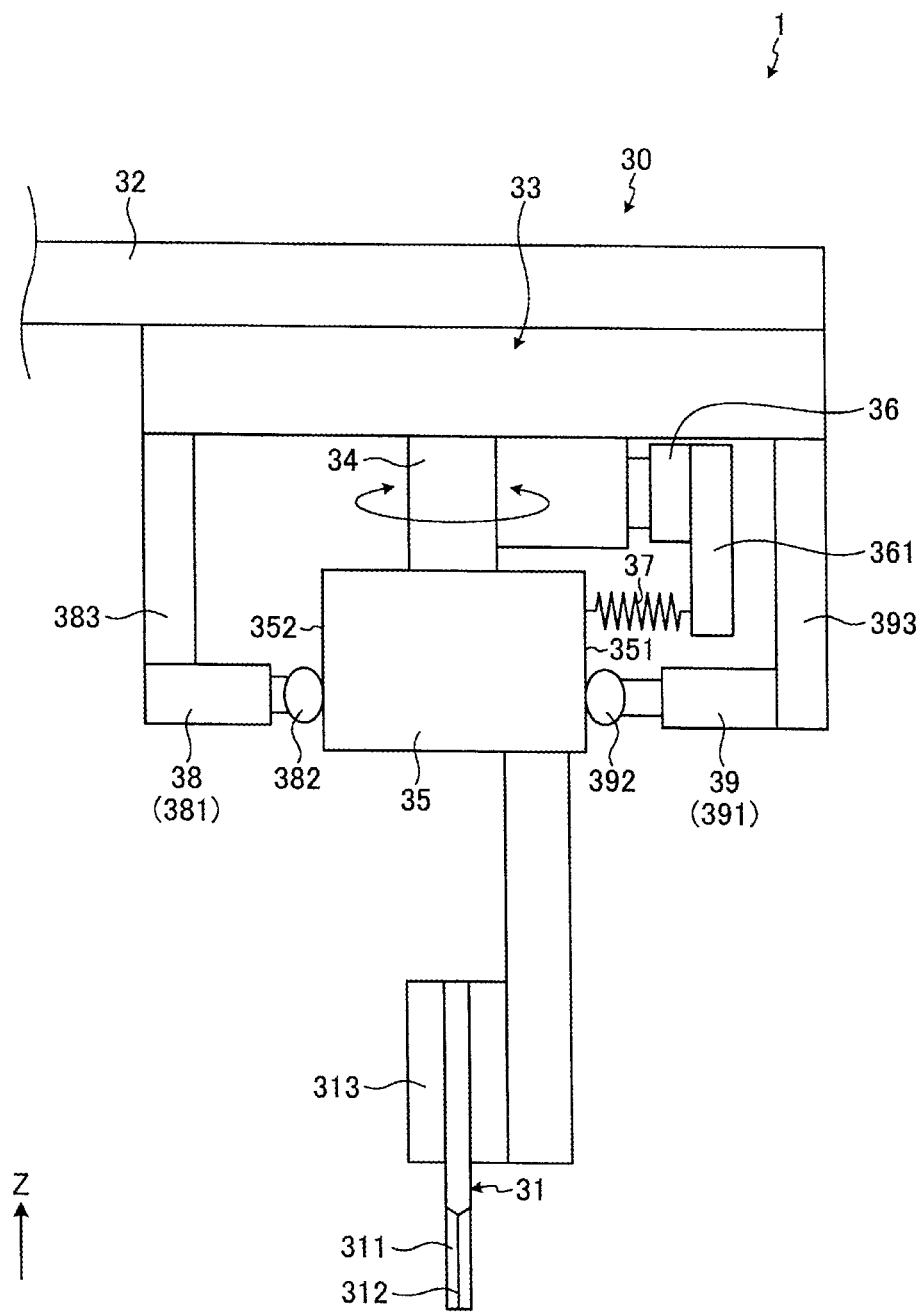
FIG. 5 is a side view illustrating the major part of the cutting unit in FIG. 1.

A protective sheet sticking apparatus 1 according to the embodiment of the present invention will be described on the basis of the drawings. FIG. 1 is a sectional view illustrating a configuration example of the protective sheet sticking apparatus 1 according to the embodiment. FIG. 2 is a plan view illustrating a wafer 100 that is a sheet sticking target of the protective sheet sticking apparatus 1 in FIG. 1. FIG. 3 is a sectional view for explaining a sheet sticking unit 20 in FIG. 1. FIG. 4 is a sectional view for explaining the outline of a cutting unit 30 in FIG. 1. FIG. 5 is a side view illustrating the major part of the cutting unit 30 in FIG. 1.

Figure 6:
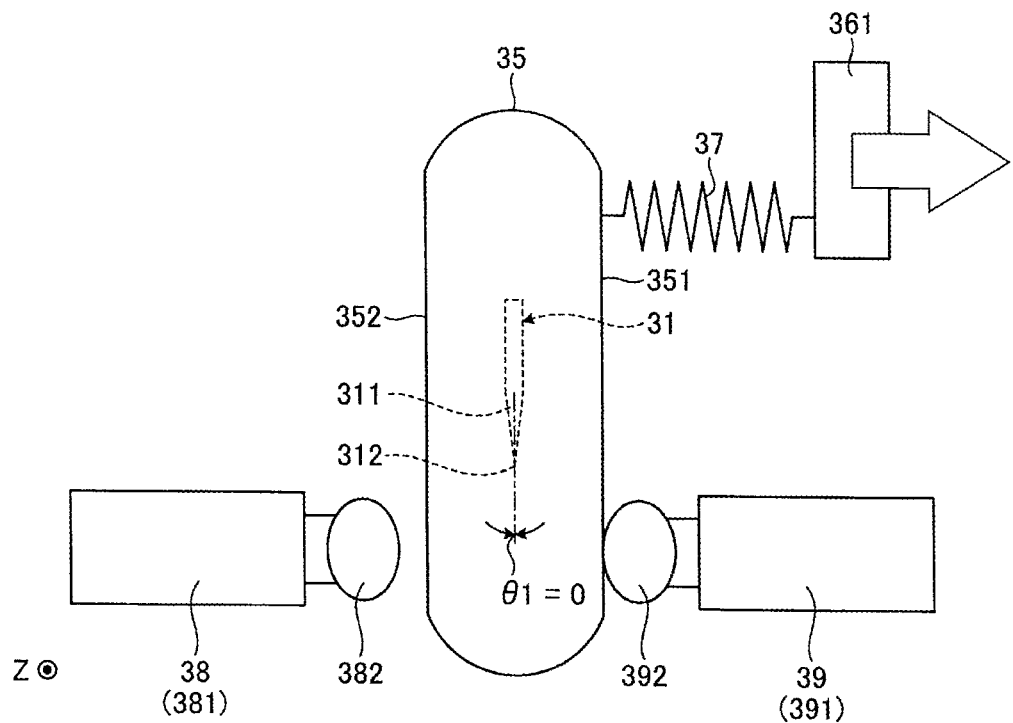
FIG. 6 is a top view illustrating the outline of the major part of the cutting unit in FIG. 1.
Figure 7:
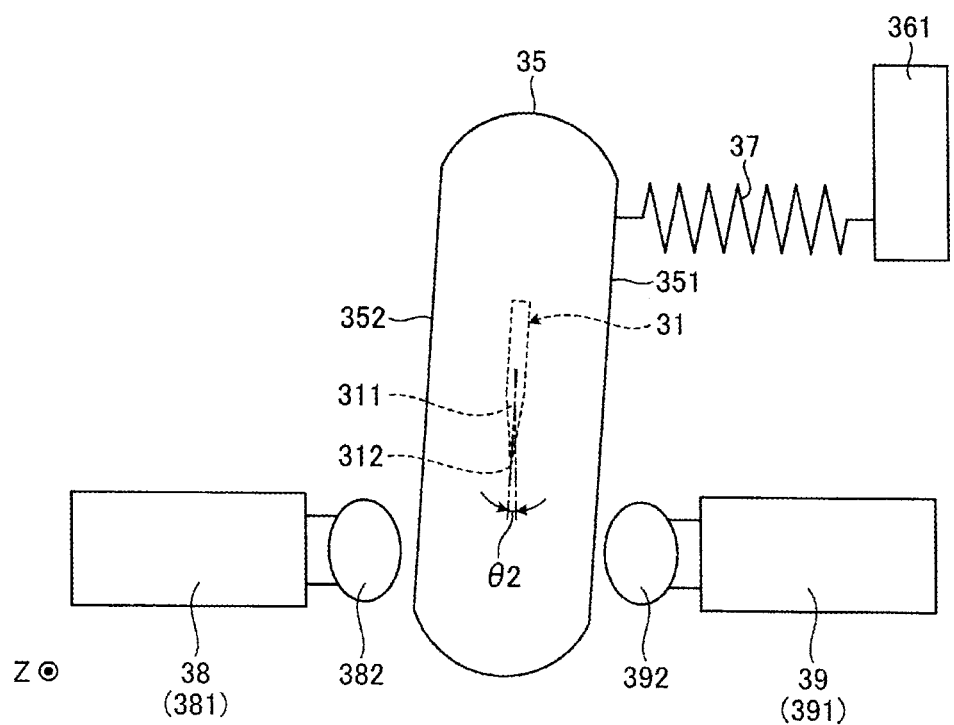
FIG. 7 is a top view illustrating the outline of the major part of the cutting unit in FIG. 1.
Figure 8:
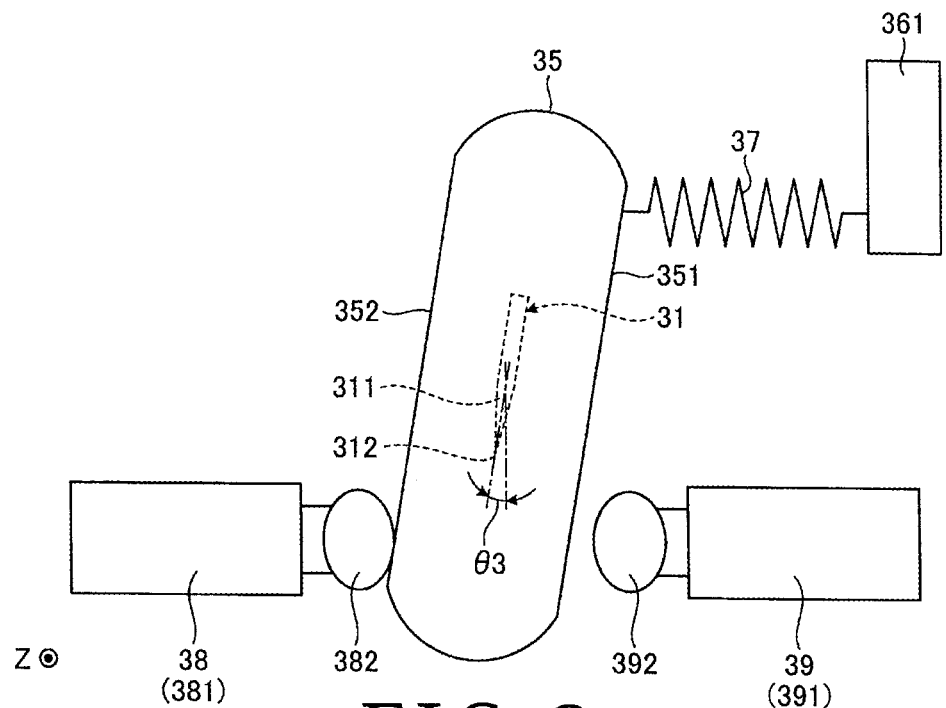
FIG. 8 is a top view illustrating the outline of the major part of the cutting unit in FIG. 1.

FIG. 6, FIG. 7, and FIG. 8 are all top views illustrating the outline of the major part of the cutting unit 30 in FIG. 1. As illustrated in FIG. 1, the protective sheet sticking apparatus 1 includes a table 10, the sheet sticking unit 20, and the cutting unit 30.

The wafer 100 that is a sheet sticking target of the protective sheet sticking apparatus 1 according to the embodiment, i.e. an adherend, is, for example, a circular plate-shaped semiconductor wafer, optical device wafer, or the like that contains silicon, sapphire, silicon carbide (SiC), gallium arsenide, or the like as the base material. As illustrated in FIG. 2, in the wafer 100, devices 103 are formed in regions marked out by plural planned dividing lines 102 formed in a lattice manner in a front surface 101. In the present embodiment, the wafer 100 has, at the outer circumference, an orientation flat 110 made by cutting off part of the wafer 100 in a linear manner along the direction of the crystal orientation in order to indicate the direction of the crystal orientation. Due to this, an outer circumferential edge 120 of the wafer 100 has a circular part 121 and a linear part 122 at which the orientation flat 110 is formed. The wafer 100 with a circular shape in the present invention includes the wafer 100 having a part made by cutting off part of the wafer 100 toward the inner circumferential side relative to the accurately circular shape (orientation flat 110, notch, or the like) at the outer circumference.

A protective sheet 200 stuck to the wafer 100 by the protective sheet sticking apparatus 1 according to the embodiment is, for example, what is called an adhesive tape having a layer-stacking structure of a base layer made of a resin and a glue layer formed of an adhesive agent made of a resin. In the present embodiment, the protective sheet 200 is stuck with the glue layer side having adhesiveness oriented toward the side of the front surface 101 of the wafer 100 and thereby protects the side of the front surface 101 of the wafer 100. The protective sheet 200 is not limited thereto in the present invention and may be stuck to the side of a back surface 104 on the opposite side to the front surface 101 instead of the side of the front surface 101 of the wafer 100. A protective sheet with only a base layer that does not have a glue layer may be pressure-bonded to the wafer 100 while the protective sheet is heated. Furthermore, the protective sheet 200 is not limited to what is called the adhesive tape in the present invention and may be what is called a thermoplastic resin sheet that is formed into a sheet shape through pressing and spreading a thermoplastic resin while heating the thermoplastic resin to soften or melt it and obtains adhesiveness by heating.

In the present embodiment, the table 10 is, for example, what is called a chuck table having a circular disc-shaped frame body in which a recessed part is formed and a suction adhesion part that is fitted into the recessed part and has a circular disc shape. The suction adhesion part of the table 10 is formed of porous ceramic and is connected to a vacuum suction source that is not illustrated in the diagram through a vacuum suction path that is not illustrated in the diagram. The upper surface of the suction adhesion part of the table 10 is a holding surface 11 on which the wafer 100 is placed and that sucks and holds the placed wafer 100. In the present embodiment, the wafer 100 is placed on the holding surface 11 with the front surface 101 oriented upward, and the holding surface 11 sucks and holds the placed wafer 100 from the side of the back surface 104. The holding surface 11 and the upper surface of the frame body of the table 10 are disposed on the same plane and are formed in parallel to the horizontal plane. In the table 10, a circular annular groove 12 having a diameter similar to the diameter of the outer circumference of the wafer 100 is formed in the upper surface of the frame body. The groove 12 functions as a clearance groove of a cutting blade 31 of the cutting unit 30 to be described later. The table 10 is not limited to what is called a porous chuck table in the present invention and may be a form that does not have the suction holding function. Furthermore, a chuck table with a smaller diameter than the wafer 100 may be used.

In the present embodiment, the sheet sticking unit 20 has a roller 21 that moves in association with rotation while rotating around the axial center parallel to the horizontal direction. As illustrated in FIG. 3, the sheet sticking unit 20 rotationally moves the roller 21 from one end of the side of the front surface 101 of the wafer 100 toward the other end with the interposition of the protective sheet 200. Thereby, while placing the protective sheet 200 sequentially from the one end of the side of the front surface 101 of the wafer 100, the sheet sticking unit 20 presses the placed protective sheet 200 against the wafer 100 with a predetermined pressing force by the roller 21, to stick the protective sheet 200 to the front surface 101 of the wafer 100. When the protective sheet 200 stuck to the wafer 100 is a thermoplastic resin sheet, the sheet sticking unit 20 heats the protective sheet 200 from the side of the roller 21 or the side of the table 10 to soften it in addition to the rotational movement of the roller 21 and thereby sticks the softened protective sheet 200 to the front surface 101 of the wafer 100.

The sheet sticking unit 20 is not limited to the form including the roller 21 in the present invention, and the protective sheet 200 may be pressed against and stuck to the front surface 101 of the wafer 100 by a pressing plate having a pressing surface with a shape and area similar to those of the table 10. Furthermore, the sheet sticking unit 20 may stick the protective sheet 200 to the front surface 101 of the wafer 100 by blowing wind thereto. Moreover, with what is called a vacuum mounter, the protective sheet 200 may be stuck to the wafer 100 by using an air pressure difference.

As illustrated in FIG. 4, the cutting unit 30 has the cutting blade 31, a circular plate 32 that holds the cutting blade 31 toward the outer circumferential edge 120 of the wafer 100, a cutting blade support part 33 that supports the cutting blade 31 rotatably around the axial center parallel to the vertical direction (Z-axis direction in FIG. 4) in such a manner that the direction of a cutting edge 312 of a cutting part 311 of the cutting blade 31 is adjustable, and a rotational drive source that rotationally drives the circular plate 32 around the axial center parallel to the vertical direction and is not illustrated in the diagram. As illustrated in FIG. 4, the cutting blade support part 33 is disposed on the lower side of the outer circumferential part of the circular plate 32 and rotationally moves along the circumferential direction of the circular plate 32 by rotating the circular plate 32 around the axial center by the rotational drive source. The cutting blade 31 rotationally moves along the circumferential direction of the circular plate 32 in association with this rotational movement of the cutting blade support part 33. As illustrated in FIG. 4, the cutting unit 30 rotates the circular plate 32 around the axial center by the rotational drive source in a state in which the cutting edge 312 of the cutting part 311 of the cutting blade 31 is made to cut into the protective sheet 200 and is slightly separated upward from the groove 12. Thereby, the cutting unit 30 rotationally moves the cutting blade 31 along the outer circumferential edge 120 of the wafer 100 and cuts off a protruding part 201 that protrudes from the outer circumferential edge 120 of the wafer 100 in the radial direction in the protective sheet 200.

For the cutting part 311 of the cutting blade 31, as illustrated in FIG. 5, a cutting blade heating part 313 that heats the cutting part 311 of the cutting blade 31 is disposed. The cutting unit 30 heats and softens the protective sheet 200 through the cutting part 311 of the cutting blade 31 and facilitates the cutting by heating the cutting part 311 of the cutting blade 31 by the cutting blade heating part 313. Therefore, without generating a burr in the protective sheet 200, the protective sheet 200 can be cut by the cutting part 311 of the cutting blade 31 in conformity with the shape of the outer circumferential edge 120 of the wafer 100 more accurately.

As illustrated in FIG. 5, the cutting blade support part 33 includes a rotating shaft member 34, a support part main body 35, a cylinder 36, a first biasing spring 37, a damper 38 including a second biasing spring 381, and a damper 39 including a third biasing spring 391. The rotating shaft member 34 is disposed on the lower side of the outer circumferential part of the circular plate 32 in parallel to the vertical direction (Z-axis direction in FIG. 5) and is supported rotatably around the axial center parallel to the vertical direction relative to the circular plate 32.

The support part main body 35 is disposed to be fixed to the lower side of the rotating shaft member 34 in such a manner as to rotate around the axial center of the rotating shaft member 34 integrally with the rotating shaft member 34. The support part main body 35 supports the cutting blade 31 on the lower side. The support part main body 35 supports the cutting blade 31 in such a manner as to orient the direction of the cutting edge 312 of the cutting part 311 of the cutting blade 31 in the circumferential direction of the circular plate 32 substantially. As illustrated in FIG. 6, the support part main body 35 has a shape that extends along the circumferential direction of the circular plate 32 substantially. The support part main body 35 rotates around the axial center together with the rotating shaft member 34 through application of an external force to any of regions on a tip side that is the side of the cutting edge 312 of the cutting part 311 relative to the rotating shaft member 34 and a base end side on the opposite side to the tip side in an outer surface 351 and an inner surface 352 oriented toward the outside and the inside, respectively, in the radial direction of the circular plate 32. The direction of the cutting edge 312 of the cutting part 311 is oriented inward in the radial direction or outward in the radial direction relative to the circumferential direction of the circular plate 32 through rotation of the support part main body 35 around the axial center together with the rotating shaft member 34.

The cylinder 36 is disposed on the lower side of the outer circumferential part of the circular plate 32 with the extension-retraction direction oriented in the radial direction of the circular plate 32. The cylinder 36 is controlled by a control unit that is included in the protective sheet sticking apparatus 1 and is not illustrated in the diagram and is switched between two stages of an extended state and a retracted state simply. One end part of the cylinder 36 is fixed to the lower side of the outer circumferential part of the circular plate 32 and a plate component 361 is disposed to be connected to the other end part that moves along the radial direction of the circular plate 32 in response to extension and retraction.

The first biasing spring 37 is disposed with the extension-compression direction oriented in the radial direction of the circular plate 32. As illustrated in FIG. 5 and FIG. 6, one end of the first biasing spring 37 is connected to the region on the base end side in the outer surface 351 of the support part main body 35, and the other end is connected to the plate component 361. When the cylinder 36 is in the retracted state, as illustrated in FIG. 6, the first biasing spring 37 becomes the state of being neither extended nor compressed and does not apply an external force to the support part main body 35. Thus, when the cylinder 36 is in the retracted state, the angle of the inclination of the direction of the cutting edge 312 of the cutting part 311 toward the inside in the radial direction with respect to the circumferential direction of the circular plate 32 (cutting edge inclination angle) becomes $\theta_1 = 0$ degrees as illustrated in FIG. 6. Regarding the cutting edge inclination angle, in the present embodiment, the angle when the direction of the cutting edge 312 of the cutting part 311 is oriented in the circumferential direction of the circular plate 32 is defined as 0 degrees as the basis, and a positive value is employed as the value of the angle when the direction of the cutting edge 312 of the cutting part 311 is oriented inward in the radial direction relative to the circumferential direction of the circular plate 32.

When the plate component 361 moves outward in the radial direction in association with switching of the cylinder 36 to the extended state, as illustrated in FIG. 7 and FIG. 8, the first biasing spring 37 is extended in association with the movement of the plate component 361 and applies an external force directed outward in the radial direction to the base end side of the outer surface 351 of the support part main body 35. Thereby, the first biasing spring 37 rotates the support part main body 35 together with the rotating shaft member 34 around the axial center in a clockwise manner as viewed from the upper side and rotates the direction of the cutting edge 312 of the cutting part 311 toward the inside in the radial direction relative to the circumferential direction of the circular plate 32. Due to this, when the cylinder 36 becomes the extended state, the cutting edge inclination angle becomes an angle larger than 0 degrees, and becomes $\theta_2$ (>0 degrees) in the example illustrated in FIG. 7 and becomes $\theta_3$ (>0 degrees) in the example illustrated in FIG. 8. As above, when the cylinder 36 is in the extended state, the first biasing spring 37 biases the direction of the cutting edge 312 of the cutting part 311 to orient the direction inward in the radial direction relative to the circumferential direction of the circular plate 32.

The damper 38 internally including the second biasing spring 381 is disposed with the extension-compression direction oriented in the radial direction of the circular plate 32. In the damper 38 internally including the second biasing spring 381, as illustrated in FIG. 5 and FIG. 6, one end 382 is oriented toward the region on the tip side in the inner surface 352 of the support part main body 35, and the other end is fixed to the lower side of the outer circumferential part of the circular plate 32 with the interposition of a fixing component 383. In the damper 38 internally including the second biasing spring 381, when the direction of the cutting edge 312 of the cutting part 311 is oriented inward in the radial direction by a predetermined angle (for example, $\theta_3$ illustrated in FIG. 8) or larger relative to the circumferential direction of the circular plate 32 due to biasing by the first biasing spring 37, the one end 382 gets contact with the region on the tip side in the inner surface 352 of the support part main body 35 and applies an external force thereto to prevent the direction of the cutting edge 312 of the cutting part 311 from being oriented inward in the radial direction by the predetermined angle or larger relative to the circumferential direction of the circular plate 32. As above, the second biasing spring 381 makes the biasing to cause the cutting edge 312 of the cutting part 311 to be oriented outward in the radial direction in order to prevent the direction of the cutting edge 312 of the cutting part 311 from being oriented inward in the radial direction by the predetermined angle or larger relative to the circumferential direction of the circular plate 32.

The damper 39 internally including the third biasing spring 391 is disposed with the extension-compression direction oriented in the radial direction of the circular plate 32. In the damper 39 internally including the third biasing spring 391, as illustrated in FIG. 5 and FIG. 6, one end 392 is oriented toward the region on the tip side in the outer surface 351 of the support part main body 35 and the other end is fixed to the lower side of the outer circumferential part of the circular plate 32 with the interposition of a fixing component 393. In the damper 39 internally including the third biasing spring 391, when the direction of the cutting edge 312 of the cutting part 311 is oriented outward in the radial direction by a predetermined angle (for example, θ1=0 degrees illustrated in FIG. 6) or larger relative to the circumferential direction of the circular plate 32 due to a reaction force (normal force) from the outer circumferential edge 120 of the wafer 100, and so forth, the one end 392 gets contact with the region on the tip side in the outer surface 351 of the support part main body 35 and applies an external force thereto to prevent the direction of the cutting edge 312 of the cutting part 311 from being oriented outward in the radial direction by the predetermined angle or larger relative to the circumferential direction of the circular plate 32. As above, the third biasing spring 391 makes the biasing to cause the cutting edge 312 of the cutting part 311 to be oriented inward in the radial direction in order to prevent the direction of the cutting edge 312 of the cutting part 311 from being oriented outward in the radial direction by the predetermined angle or larger relative to the circumferential direction of the circular plate 32.

As above, the cutting unit 30 orients the direction of the cutting edge 312 of the cutting part 311 inward in the radial direction relative to the circumferential direction of the circular plate 32 by the first biasing spring 37, and makes restriction, by the second biasing spring 381 and the third biasing spring 391, to prevent the direction of the cutting edge 312 of the cutting part 311 from inclining inward in the radial direction and outside in the radial direction, respectively, by the predetermined angle or larger.

The control unit that is included in the protective sheet sticking apparatus 1 and is not illustrated in the diagram controls operation of various kinds of constituent elements of the protective sheet sticking apparatus 1 and causes the protective sheet sticking apparatus 1 to execute sticking processing to stick the protective sheet 200 to the front surface 101 of the wafer 100 and cutting-off processing to cut off the protruding part 201 of the protective sheet 200. The control unit of the protective sheet sticking apparatus 1 includes a computer system in the present embodiment. The computer system included in the control unit has a calculation processing device having a microprocessor like a central processing unit (CPU), a storing device having a memory like a read only memory (ROM) or random access memory (RAM), and an input-output interface device. The calculation processing device of the control unit executes calculation processing in accordance with a computer program stored in the storing device of the control unit and outputs a control signal for controlling the protective sheet sticking apparatus 1 to the respective constituent elements of the protective sheet sticking apparatus 1 through the input-output interface device of the control unit.

Figure 9:
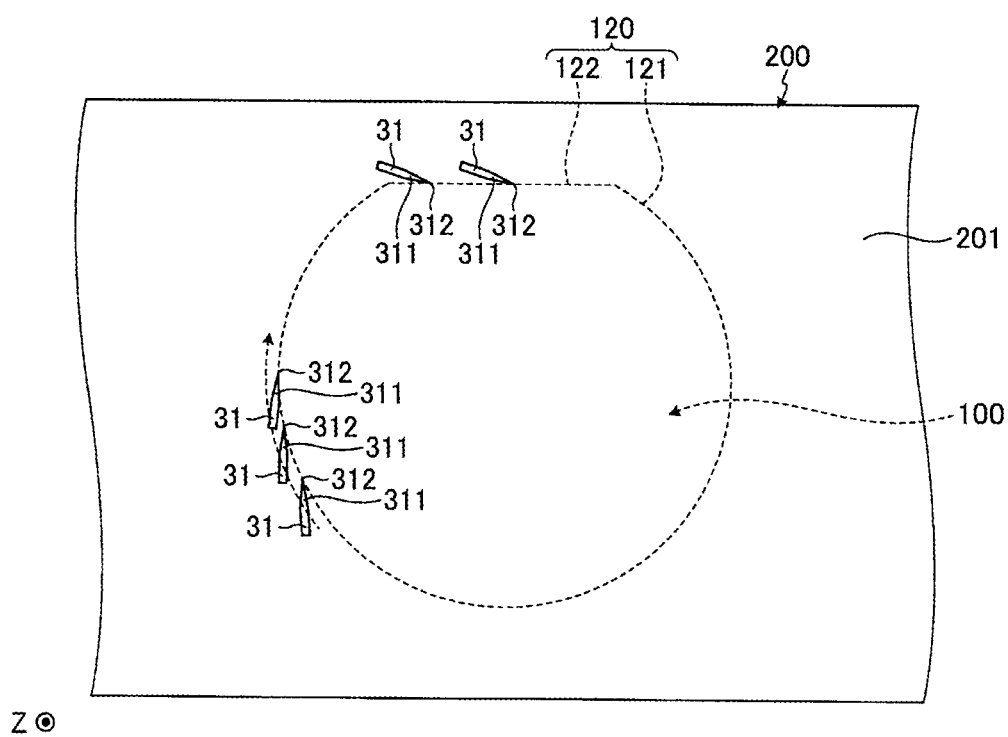
FIG. 9 is a plan view illustrating operation of the cutting unit in FIG. 1.

Next, the present specification will describe operation of the cutting unit 30 of the protective sheet sticking apparatus 1 according to the embodiment by using drawings. FIG. 9 is a plan view illustrating the operation of the cutting unit 30 in FIG. 1. As illustrated in FIG. 9, the cutting unit 30 cuts the protective sheet 200 stuck to the wafer 100 by the sheet sticking unit 20 along the outer circumferential edge 120 of the wafer 100 while bringing the cutting part 311 of the cutting blade 31 into contact with the outer circumferential edge 120 of the wafer 100, to cut off the protruding part 201. In the present embodiment, the cutting unit 30 cuts the protective sheet 200 by the cutting part 311 of the cutting blade 31 from the side of the protective sheet 200 stuck to the wafer 100. However, the configuration is not limited thereto in the present invention, and the protective sheet 200 may be cut from the side of the wafer 100.

First, the cutting unit 30 makes the cutting edge 312 of the cutting part 311 of the cutting blade 31 cut into the protective sheet 200 and positions the cutting edge 312 into the state of being slightly separated upward from the groove 12. Then, the cutting unit 30 switches the cylinder 36 from the retracted state to the extended state and biases the direction of the cutting edge 312 of the cutting part 311 to cause the direction to be oriented inward in the radial direction relative to the circumferential direction of the circular plate 32 by the first biasing spring 37. Thereby, the cutting unit 30 brings the cutting part 311 into contact with the outer circumferential edge 120 of the wafer 100. Next, by rotating the circular plate 32 around the axial center by the rotational drive source, the cutting unit 30 moves the cutting part 311 of the cutting blade 31 along the outer circumferential edge 120 of the wafer 100 while bringing the cutting part 311 into contact with the outer circumferential edge 120 of the wafer 100. Thereby, the cutting unit 30 cuts the protective sheet 200 stuck to the wafer 100 along the outer circumferential edge 120 of the wafer 100.

When the cutting part 311 of the cutting blade 31 is moving along the outer circumferential edge 120 of the wafer 100 while being contact with the outer circumferential edge 120, while the cutting part 311 receives the biasing by the first biasing spring 37 and the direction of the cutting edge 312 is oriented inward in the radial direction relative to the circumferential direction of the circular plate 32, the cutting part 311 receives a reaction force from the outer circumferential edge 120 in association with being pressed against the outer circumferential edge 120 of the wafer 100, and the direction of the cutting edge 312 is pushed back outward in the radial direction relative to the circumferential direction of the circular plate 32. Due to this, when the cutting part 311 of the cutting blade 31 is moving along the circular part 121 of the outer circumferential edge 120 of the wafer 100 while being contact with the circular part 121, the cutting edge inclination angle is kept at an angle suitable for the cutting of the protective sheet 200 (for example, approximately θ2) as illustrated in FIG. 7.

Because the orientation flat 110 is formed by cutting off part of the wafer 100 toward the inside relative to the circumference, the reaction force received by the cutting part 311 of the cutting blade 31 from the linear part 122 at which the orientation flat 110 is formed is weaker than the reaction force received from the circular part 121. Thus, when the cutting part 311 of the cutting blade 31 is moving along the linear part 122 at which the orientation flat 110 is formed in the outer circumferential edge 120 of the wafer 100 while being contact with the linear part 122, the cutting edge inclination angle becomes a larger angle (for example, approximately θ3) than that when the cutting part 311 is moving along the circular part 121 as illustrated in FIG. 8. When moving along the linear part 122, the cutting part 311 of the cutting blade 31 can smoothly move in such a manner as to follow the linear part 122 at which the orientation flat 110 is formed in the outer circumferential edge 120 of the wafer 100 because the cutting edge inclination angle is larger than that when the cutting part 311 is moving along the circular part 121. As above, for the cutting part 311 of the cutting blade 31, without particularly controlling the biasing force by the first biasing spring 37, the cutting edge inclination angle is automatically adjusted according to the shape of the outer circumferential edge 120 of the wafer 100, and the movement path is adjusted to follow the outer circumferential edge 120 of the wafer 100.

Furthermore, the cutting part 311 of the cutting blade 31 is restricted by the damper 38 internally including the second biasing spring 381 in such a manner that the direction of the cutting edge 312 of the cutting part 311 is prevented from inclining inward in the radial direction by the predetermined angle or larger. Therefore, even when the cutting part 311 is moving along the linear part 122 at which the orientation flat 110 is formed, the direction of the cutting edge 312 is prevented from being oriented inward in the radial direction beyond the range of the cutting edge inclination angle in which the protective sheet 200 can be cut sufficiently smoothly. Moreover, the cutting part 311 of the cutting blade 31 is restricted by the damper 39 internally including the third biasing spring 391 in such a manner that the direction of the cutting edge 312 of the cutting part 311 is prevented from inclining outward in the radial direction by the predetermined angle or larger. Therefore, the direction of the cutting edge 312 is prevented from being oriented outward in the radial direction beyond the range of the cutting edge inclination angle in which the protective sheet 200 can be cut sufficiently smoothly.

The protective sheet sticking apparatus 1 according to the embodiment having the above configuration makes biasing, by the first biasing spring 37, to cause the direction of the cutting edge 312 of the cutting part 311 to be oriented inward in the radial direction relative to the circumferential direction of the circular plate 32. Therefore, the protective sheet sticking apparatus 1 can easily cause the direction of the cutting edge 312 of the cutting part 311 to follow both the circular part 121 of the outer circumferential edge 120 of the wafer 100 having the orientation flat 110 and the linear part 122 of the orientation flat 110. Thus, the protective sheet sticking apparatus 1 according to the embodiment provides an effect that the protective sheet 200 can be properly cut also for the wafer 100 having the orientation flat 110 without newly adding an actuator for controlling the table or the cutting blade.

Furthermore, the protective sheet sticking apparatus 1 according to the embodiment makes biasing outward in the radial direction, by the second biasing spring 381, to prevent the direction of the cutting edge 312 of the cutting part 311 from being oriented inward in the radial direction by the predetermined angle or larger relative to the circumferential direction of the circular plate 32. Therefore, the protective sheet sticking apparatus 1 can prevent the direction of the cutting edge 312 of the cutting part 311 from excessively inclining inward in the radial direction. This provides an effect that the protective sheet 200 can be cut more properly also for the linear part 122 at which the orientation flat 110 is formed.

Moreover, the protective sheet sticking apparatus 1 according to the embodiment makes biasing inward in the radial direction, by the third biasing spring 391, to prevent the direction of the cutting edge 312 of the cutting part 311 from being oriented outward in the radial direction by the predetermined angle or larger relative to the circumferential direction of the circular plate 32. Therefore, the protective sheet sticking apparatus 1 can prevent the direction of the cutting edge 312 of the cutting part 311 from excessively inclining outward in the radial direction. This provides an effect that the protective sheet 200 can be cut more properly also for the wafer 100 having the orientation flat 110.

It is noted that the present invention is not limited to the above-described embodiment. That is, the present invention can be carried out with various modifications without departing from the gist of the present invention. For example, in the above-described embodiment, the protective sheet 200 is cut along the outer circumferential edge 120 of the wafer 100 in which the orientation flat 110 is formed. However, in the present invention, the protective sheet 200 may be cut along the outer circumferential edge 120 of the wafer 100 in which not only the orientation flat 110 but a part made by cutting off part of the wafer 100 into a given shape toward the inner circumferential side relative to the accurately circular shape is formed at the outer circumference.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A protective sheet sticking apparatus that sticks a protective sheet to a wafer with a circular shape, the protective sheet sticking apparatus comprising:
    a sheet sticking unit that sticks the protective sheet to the wafer held by a table; and
    a cutting unit that cuts the protective sheet stuck to the wafer by the sheet sticking unit along an outer circumference of the wafer while bringing a cutting part of a cutting blade into contact with the outer circumference of the wafer, wherein:
    the cutting unit has a cutting blade support part that supports the cutting blade rotatably in such a manner that a direction of a cutting edge of the cutting part is adjustable from an outside in a radial direction of the wafer to an inside,
    the cutting blade support part includes:
        a first biasing spring that makes biasing to cause the cutting part to be oriented toward the inside, and
        a second biasing spring that makes biasing to cause the cutting part to be oriented toward the outside in order to prevent the cutting part from being oriented toward the inside by a predetermined angle or larger, and
    a direction of the cutting part is adjusted according to the shape of the outer circumference of the water.

2. The protective sheet sticking apparatus according to claim 1, wherein:
    the cutting blade support part further includes a third biasing spring that makes biasing to prevent the direction of the cutting part from being oriented toward the outside by a predetermined angle or larger.

* * * * *